United States Patent
Brunco et al.

(10) Patent No.: US 9,064,702 B2
(45) Date of Patent: Jun. 23, 2015

(54) METHOD FOR MANUFACTURING SEMICONDUCTOR DEVICES

(71) Applicants: IMEC, Leuven (BE); GLOBALFOUNDRIES INC., Grand Cayman (KY)

(72) Inventors: David Brunco, Hillsboro, CA (US); Geert Eneman, Balen (BE)

(73) Assignees: IMEC, Leuven (BE); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/956,273

(22) Filed: Jul. 31, 2013

(65) Prior Publication Data
US 2014/0038426 A1 Feb. 6, 2014

(30) Foreign Application Priority Data
Jul. 31, 2012 (EP) .................................. 12005685

(51) Int. Cl.
*H01L 21/31* (2006.01)
*H01L 21/469* (2006.01)
(Continued)

(52) U.S. Cl.
CPC ...... *H01L 21/02565* (2013.01); *H01L 29/7843* (2013.01); *H01L 21/0243* (2013.01); *H01L 21/02664* (2013.01); *H01L 21/324* (2013.01); *H01L 21/02521* (2013.01)

(58) Field of Classification Search
CPC ............ H01L 29/7843; H01L 29/7846; H01L 21/762
USPC .................................... 438/763; 257/E21.317
See application file for complete search history.

(56) References Cited

U.S. PATENT DOCUMENTS 4,819,040 A * 4/1989 Tobin ............................ 257/369
5,256,550 A 10/1993 Laderman et al.
(Continued)

FOREIGN PATENT DOCUMENTS

| EP | 0 407 233 B1 | 3/1996 |
|---|---|---|
| WO | WO 2006/032298 A1 | 3/2006 |
| WO | WO 2011/030001 A1 | 3/2011 |

OTHER PUBLICATIONS

Bai et al., "Study of the defect elimination mechanisms in aspect ratio trapping Ge growth, Applied Physics Letters," vol. 90, Issue 10, 101902, 4 pgs., 2007.
Destefanis et al., Selective epitaxial growth of Ge(1 1 0) in trenches using the aspect ratio trapping technique, Journal of Crystal Growth, vol. 312, pp. 918-925, 2010.
(Continued)

*Primary Examiner* — Matthew Landau
*Assistant Examiner* — Igwe U Anya
(74) *Attorney, Agent, or Firm* — Knobbe, Martens, Olson & Bear LLP

(57) ABSTRACT

A method for reducing defects in an active device area of a semiconductor device during fabrication is disclosed. In one aspect, the method comprises providing the active device area adjacent an isolation structure, wherein a substantially planar surface is formed over the isolation structure and the active device area, forming a patterned stress-inducing layer over the substantially planar surface, forming at least one screening layer between the patterned stress-inducing layer and the substantially planar surface, where the screening layer is configured to screen part of the stress field induced by the patterned stress-inducing layer, performing an anneal process after forming the patterned stress-inducing layer on the substantially planar surface, so as to induce a movement of the defects towards a contact interface between the active device area and the isolation structure, and removing the patterned stress-inducing layer from the substantially planar surface.

14 Claims, 12 Drawing Sheets

(51) Int. Cl.
  *H01L 21/02* (2006.01)
  *H01L 29/78* (2006.01)
  *H01L 21/324* (2006.01)

(56) References Cited

U.S. PATENT DOCUMENTS

| | | | | |
|---|---|---|---|---|
| 5,894,059 | A | * | 4/1999 | Peidous et al. ............... 430/316 |
| 7,232,742 | B1 | * | 6/2007 | Maekawa ....................... 438/476 |
| 7,754,008 | B2 | | 7/2010 | Xie et al. |
| 7,943,961 | B2 | * | 5/2011 | Wang et al. ................... 257/178 |
| 7,977,147 | B2 | | 7/2011 | Clifton |
| 2002/0061648 | A1 | | 5/2002 | Lo et al. |
| 2002/0093060 | A1 | * | 7/2002 | Miura et al. ................... 257/377 |
| 2006/0081896 | A1 | | 4/2006 | Maeda |
| 2009/0273010 | A1 | * | 11/2009 | Simoen et al. ................ 257/288 |
| 2011/0281410 | A1 | | 11/2011 | Liu et al. |

OTHER PUBLICATIONS

Extended European Search Report issued on Jan. 21, 2013 for EP Application No. 12005685.8.

Hull et al., Introduction to Dislocations, $4^{th}$ ed., Butterworth & Heinemann, 2001.

Patel et al., "Velocities of Individual Dislocations in Germanium," Journal of Applied Physics, vol. 42, pp. 3298-3303, 1971.

Zaumseil et al., "A complex x-ray structure characterization of Ge thin film heterostructures integrated on Si(001) by aspect ratio trapping and epitaxial lateral overgrowth selective chemical vapor deposition techniques," Journal of Applied Physics, vol. 106, No. 9, 093524, 8 pgs., 2009.

Zhang et al., "Removal of Threading Dislocations from Patterned Heteroepitaxial Semiconductors by Glide to Sidewalls," Journal of Electronic Materials, vol. 27, No. 11, pp. 1248-1253, 1998.

* cited by examiner

METHOD FOR MANUFACTURING SEMICONDUCTOR DEVICES

INCORPORATION BY REFERENCE TO RELATED APPLICATIONS

Any and all priority claims identified in the Application Data Sheet, or any correction thereto, are hereby incorporated by reference under 37 CFR 1.57. This application claims foreign priority to European patent application EP 12005685.8 filed on Jul. 31, 2012, the contents of which is incorporated by reference herein in its entirety, and is hereby expressly made a part of this specification.

FIELD OF THE INVENTION

The disclosed technology generally relates to methods for manufacturing semiconductor devices, and more particularly relates to methods for manufacturing active layers of semiconductor devices, e.g., channel layers of transistor devices with a reduced level of defects and improved performance.

BACKGROUND OF THE INVENTION

Hetero-epitaxial growth of a semiconductor material (e.g. SiGe or Ge) on another (e.g. Si) semiconductor material often results in defects, for instance dislocations, which may be caused by a mismatch in lattice constants between the two semiconductor materials.

Growth in confined spaces, as performed with the technique of Aspect Ratio Trapping (ART), can reduce defects that are growing near the edges of the confined space (e.g. towards a shallow trench isolation (STI)). See for instance "Study of the defect elimination mechanisms in aspect ratio trapping Ge growth", Bai, J. et al., Applied Physics Letters, Volume 90, Issue 10, id. 101902 (2007). This technique does not provide a solution for reducing defects as for instance dislocations near the center of the active device or active device layer. The presence of defects, as for instance dislocations, in an active device layer, as for instance a channel layer of a transistor device, is especially a concern for FinFETs and similar devices, wherein high mobility channel materials are integrated onto Si wafers.

SUMMARY OF CERTAIN INVENTIVE ASPECTS

A method for reducing defects in an active device area of a semiconductor device during fabrication is disclosed.

In one aspect, the method comprises providing the active device area adjacent an isolation structure, wherein a substantially planar surface is formed over the isolation structure and the active device area. The method additionally comprises forming a patterned stress-inducing layer over the substantially planar surface, where the patterned stress-inducing layer is configured to induce a stress field in the active device area which results in a shear stress being applied on defects present in the active device area. The method additionally comprises forming at least one screening layer between the patterned stress-inducing layer and the substantially planar surface, where the screening layer is configured to screen part of the stress field induced by the patterned stress-inducing layer. The method additionally comprises performing an anneal process after forming the patterned stress-inducing layer on the substantially planar surface, so as to induce a movement of the defects towards a contact interface between the active device area and the isolation structure, wherein the stress field in the active device area has a sign and a magnitude that are conducive to movement of the defects in the active device area towards the contact interface during the anneal process. The method further comprises removing the patterned stress-inducing layer from the substantially planar surface.

It is an advantage of the present disclosure that defects as for instance dislocations can be strongly reduced or completely removed from an active layer of a semiconductor device.

It is a further advantage that defects can be strongly reduced or completely removed from a central region of an active semiconductor device layer.

An active device layer of a semiconductor device can be a layer in which charge carriers flow from one electrode to another, whereby the flow can be controlled either inherently like a diode or explicitly, e.g. the source to the drain in a field effect transistor whereby the flow of charge is controlled by a gate. An active layer or layer stack can comprise an electrically controllable material such as a semiconductor material configured to provide an electrical function such as a diode function or whose electrical conductivity can be modulated by a control electrode such as a gate.

For the purpose of the present disclosure, a dislocation can be a crystallographic line defect, or irregularity, within a crystal structure. A more detailed description of dislocations is available, for instance, in the book "Introduction to Dislocations" by Derek Hull and D. J. Bacon.

It will be appreciated that the actual required stress would depend upon the device dimensions, materials, and annealing temperatures. According to preferred embodiments, the intrinsic stress in the patterned stress-inducing layer is between 100 MPa and 5 GPa. Either compressive or tensile stresses can be used.

In preferred embodiments of the present disclosure, the active device layer is a germanium layer, or may comprise germanium. It can be a SiGe layer. According to preferred embodiments, the active device layer is or comprises $Si_xGe_{1-x}$, wherein x is between about 0 and 0.8, or between about 0 and 0.7, or between about 0 and 0.6, or between about 0 and 0.5, or between about 0 and 0.4, or between about 0 and 0.3, or between about 0 and 0.2.

In alternative embodiments, it can be a silicon layer, or may comprise silicon. In alternative embodiments, the active device layer is or comprises GeSn alloys, III-V materials as for instance GaN, GaAs, InAs, InSb, InP, ternary or quaternary III-V compounds.

In preferred embodiments according to the present disclosure, the patterned stress-inducing layer comprises silicon nitride. In embodiments according to the present invention, the patterned stress-inducing layer comprises any of or any combination of SiN, TiN, W, $SiO_2$, $HfO_2$, $Al_2O_3$, and mixed oxides such as hafnium silicates and/or hafnium aluminates.

According to preferred embodiments of the present invention, the thickness of the patterned stress-inducing layer is between 5 and 100 nm, more preferably between 10 and 30 nm.

According to preferred embodiments, the method further comprises providing at least one screening layer in between the patterned stress-inducing layer and the common substantially planar surface, the screening layers being adapted for screening part of the stress field induced by the patterned stress-inducing layer, such that the stress field in the active layer is of a sign and magnitude conducive to defect (for instance dislocation) movement in the active layer towards the contact interface during the anneal step. One, two, or a plurality of screening layers can be provided.

It is an advantage that by using the at least one screening layer, the stress field induced by the patterned stress-inducing layer in the active layer, for instance its direction and/or uniformity, can be better controlled.

By appropriately choosing the at least one screening layer and stress-inducing layer, for a certain active device layer, it is possible to generate a shear stress field which is substantially unidirectional in the relevant portions of the active area, and in certain embodiments even substantially uniform.

According to preferred embodiments, the at least one screening layer is an unpatterned, complete layer. The at least one screening layer preferably covers a whole front main surface of an underlying substrate.

It has been shown that such a layer provides an improved performance when compared to one or more patterned screening layers.

According to preferred embodiments, the at least one screening layer comprises a silicon oxide. The silicon oxide layer can be deposited by a process of the CVD or ALD type. The silicon oxide may further comprise one or more other element that may affect the mechanical properties of the oxide as for instance the Young's modulus or shear modulus, which may influence the optimal thickness of the oxide. These other elements may for instance comprise one or more of C, H, N, F.

According to preferred embodiments, the screening layers comprise a first deposited layer comprised mainly of Si and N, e.g. SiN, and a second deposited layer comprised mainly of Si and O, e.g. $SiO_2$.

According to preferred embodiments, providing a patterned stress-inducing layer on the common substantially planar surface comprises providing a unpatterned stress-inducing layer and patterning the unpatterned stress-inducing layer by etching, and wherein the screening layer or upper layer of a plurality of screening layers are adapted for acting as an etch stop layer for a patterned etch of the patterned stress-inducing layer.

According to preferred embodiments, the combined total thickness of the one or more (a plurality of) screening layer(s) is between 5 and 50 nm.

It has been shown that thicknesses lying within this range show optimal performance. Other thicknesses are although not excluded.

According to preferred embodiments, the patterned stress-inducing layer comprises/is a silicon nitride layer, an upper screening layer comprises/consists of $SiO_2$ and a lower screening layer comprises/consists of SiN.

For the purpose of the present disclosure, when reference is made to a SiN layers, or SiN stress-inducing layers, it should be understood that these layers mainly comprise silicon and nitrogen. The silicon nitride may have a stoichiometry of approximately $Si_3N_4$, but this may be different. These layers may further comprise impurity elements as for instance C, H, O, as is typically the case for films deposited by industry standard chemical vapor deposition techniques.

According to preferred embodiments, the anneal step is performed at a temperature between 450° C. and 1100° C. According to preferred embodiments, the anneal step is performed at a temperature between 500° C. and 650° C.

According to preferred embodiments, the duration of the anneal step is chosen appropriately such that the defects, for instance, dislocations, have enough time to move to the contact interface. The duration can be from one or more milliseconds up until a few, e.g. 6 hours. Typically relatively low temperatures will require relatively long durations. The duration is typically a function of the active layer dimension and typical defect or dislocation movement velocity.

According to preferred embodiments, the method further comprises removing the SiN patterned stress-inducing layer in an aqueous solution comprising phosphoric acid, removing the upper screen layer in an aqueous solution containing hydrofluoric acid, and removing a SiN lower screen layer in an aqueous solution containing phosphoric acid. In a particular embodiment, two screen layers (SiOx/SiN) are combined with a SiN patterned stress-inducing layer. The upper screen layer (SiOx) serves as an etch stop for the SiN patterned stress-inducing layer. The lower screen layer (SiN) then serves as an etch stop layer for the upper SiO2 screen layer and protects the isolation oxide that is below it. Finally, the lower screen SiN screen layer is removed with a short etch in hot phosphoric acid.

According to preferred embodiments, the isolation structure comprises SiOx. The isolation structure may for instance comprise or consist of a shallow trench isolation structure (STI structure). The STI structure may comprise or consist of silicon oxide.

According to preferred embodiments, the common planar surface is prepared by Chemical Mechanical Polishing.

According to preferred embodiments, wherein providing a patterned stress-inducing layer comprises providing a stress-inducing layer and patterning the stress-inducing layer, and wherein the patterning of the patterned stress-inducing layer defines features on the common substantially planar surface with boundaries which are substantially parallel to boundaries of the active layer. These substantially parallel boundaries lie at close distance from, for instance within a distance smaller than 30 nm from, the boundaries of the active layer.

In another view, the projection of the patterned stress-inducing layer on the common substantially planar surface defines boundaries which are at least partially substantially parallel, or substantially parallel to boundaries of the active layer, the substantially parallel boundaries lying at close distance from, for instance within a distance smaller than 30 nm from, the boundaries of the active layer. The projection is preferably an orthogonal projection on the common main surface. It can be an orthogonal projection on a main surface of an underlying substrate.

The patterned stress-inducing layer may define a plurality of stress-inducing structures. Some of these structures may be connected to other stress-inducing structures. It will be appreciated that for connected stress-inducing structures, their respective stress field can be dependent. Some of these structures may be disconnected from any other stress-inducing structures. The patterned stress-inducing layer may define a plurality of disconnected structures. It will be appreciated that for disconnected stress-inducing structures, the respective stress fields are substantially independent.

Advantageously, the stress-inducing layer, or the respective stress-inducing structures, is provided at locations close to the boundaries of the active device layers, to provide an optimal effect. According to preferred embodiments the stress-inducing layer, or the stress-inducing structures, define boundaries the projections of which are lying parallel with the boundaries of the active device layer. It will be appreciated that an active device layer can be a channel layer of a transistor device. The transistor device can be of the planar or non-planar type. A transistor device of the non-planar type can be for instance a transistor of the FINFET type or similar type as known to the skilled person. It can typically have a longitudinal shape. The projected boundaries of the active device layer on the common main surface, or on a main surface of the underlying substrate, can for instance be rectangular, rectangular with rounded corners, elliptical, or can have any other shape known as suitable for the skilled person.

The projected boundaries of the patterned stress-inducing layer may be substantially parallel, or at least partially substantially parallel with respective boundaries of active device layer, and may include a plurality of parallel sections with a length corresponding to active device layer length, for instance channel layer length.

According to preferred embodiments, adjacent projected substantially parallel boundaries of the patterned stress-inducing layer are positioned within a distance smaller than 30 nm from different adjacent neighboring channel layers.

This provides the advantage that alignment requirements can be relatively loose, as explained as follows. One can consider adjacent channel regions (example of an active device layer), both being longitudinal and substantially rectangular shaped in projection, the boundaries of the same or different channel regions along the length direction being parallel. A single stress-inducing structure (e.g. also rectangular in projection) can be applied, acting on boundaries in the length direction of different adjacent channel regions. While adjacent projected substantially parallel boundaries of the patterned stress-inducing layer are positioned within close distance from, for instance within a distance smaller than 30 nm from, different adjacent neighboring channel layers, the single stress-inducing structure itself can extend over at least one of the adjacent channel regions. The stress-inducing structure can thus have width which is equal or larger than the distance between the two adjacent active channel regions. The stress-inducing structure can have a width which is larger than the combined width of the two adjacent channel regions and their inter distance (i.e. separation distance between two adjacent channel regions). The requirement of "closeness", e.g. the requirement of lying within a range of less than 30 nm, of the boundaries of channel region boundary and stress-inducing layer/stress-inducing structure boundary, applies to each of the boundaries independently. Moreover, deviations within this range do not substantially impact the effect of the method according to aspects of the present invention.

According to preferred embodiments, the patterned stress-inducing layer is provided fully on an isolation structure, for instance an STI structure.

According to preferred embodiments, the patterned stress-inducing layers is provided at least partially on the active region, for instance at least partially overlapping the active region.

According to preferred embodiments, the stress-inducing structures extend over at least two adjacent active layers.

According to further embodiment of the present invention, the method according to any of the previous embodiments further comprises one or more iterations of providing a patterned stress-inducing layer on the common substantially planar surface, the stress-inducing layer being adapted for inducing a stress on the active layer, the induced stress resulting in a shear stress on defects, e.g. dislocations, present in the active layer, performing an anneal step, and removing the patterned stress-inducing layer from the common planar surface.

According to some embodiments, the respective patterned stress-inducing layers comprise a different predetermined pattern, and the combination of stresses induced by the subsequent stress induced layers induces a movement of said defects, e.g. dislocations, towards said contact interface.

According to some embodiments, the method may further comprise performing a CMP process after a last iteration of the removal of the patterned stress-inducing layer and optionally screen layer(s) (if applicable).

According to preferred embodiments, the method further comprises performing a CMP process after the removal of the patterned stress-inducing layer, or at each iteration thereof.

According to some embodiments, any of the above methods further may comprise a step of removing an upper part of the active layer. This may provide the advantage that defects remaining in the upper part of the active layer, due for example, to excessively high stress or stress applied in the wrong direction, could be effectively removed. Thus, the remaining, high crystal quality part of the active layer is available for the fabrication of devices.

For the purpose of the present disclosure, whenever ranges are defined, it is intended to disclose these ranges in their closed, open, and two half open forms. All these options are meant to be disclosed even if the term "between" is used in the context of defining such ranges.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims.

Figure 1:
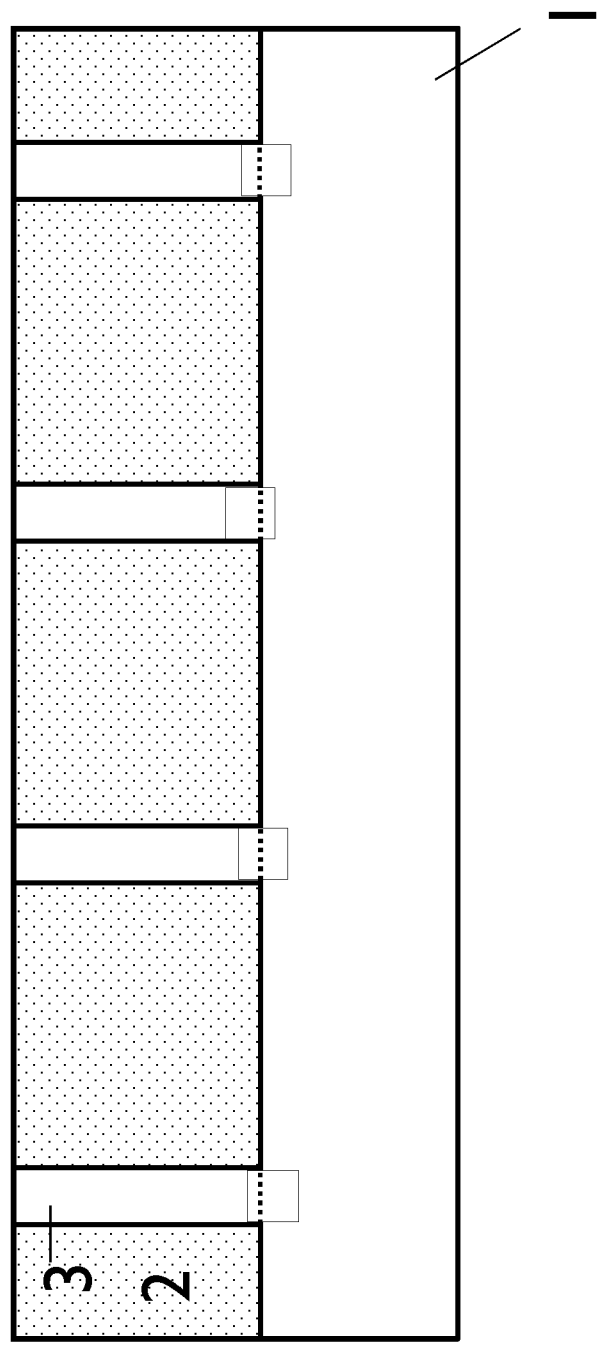
FIG. 1 illustrates a wafer after processing of a standard Shallow Trench Isolation module.

FIG. 1 provides a schematic wafer cross section after a standard shallow trench isolation flow. This comprises a base substrate 1 comprising a first semiconductor material, for instance silicon, a plurality of isolation regions 2 provided on a first main surface of the base substrate 1, for instance a silicon oxide layer, and a plurality of active lines 3 formed between the isolation regions and connected to the base substrate. The active lines are electrically separated from each other by the isolation regions 2. At this point in the process flow, the active lines 3 typically comprise the same semiconductor material as the base substrate, i.e., the first semiconductor material. In the following, embodiments having silicon as the first semiconductor material are discussed. However, other embodiments are possible, where the first semiconductor material comprises silicon alloyed with other semiconductor materials belonging to Group IV of the periodic table, e.g., C, Ge, and Sn. In other embodiments, the first semiconductor material comprises other semiconductor materials not belonging to Group IV of the periodic table.

Figure 2:
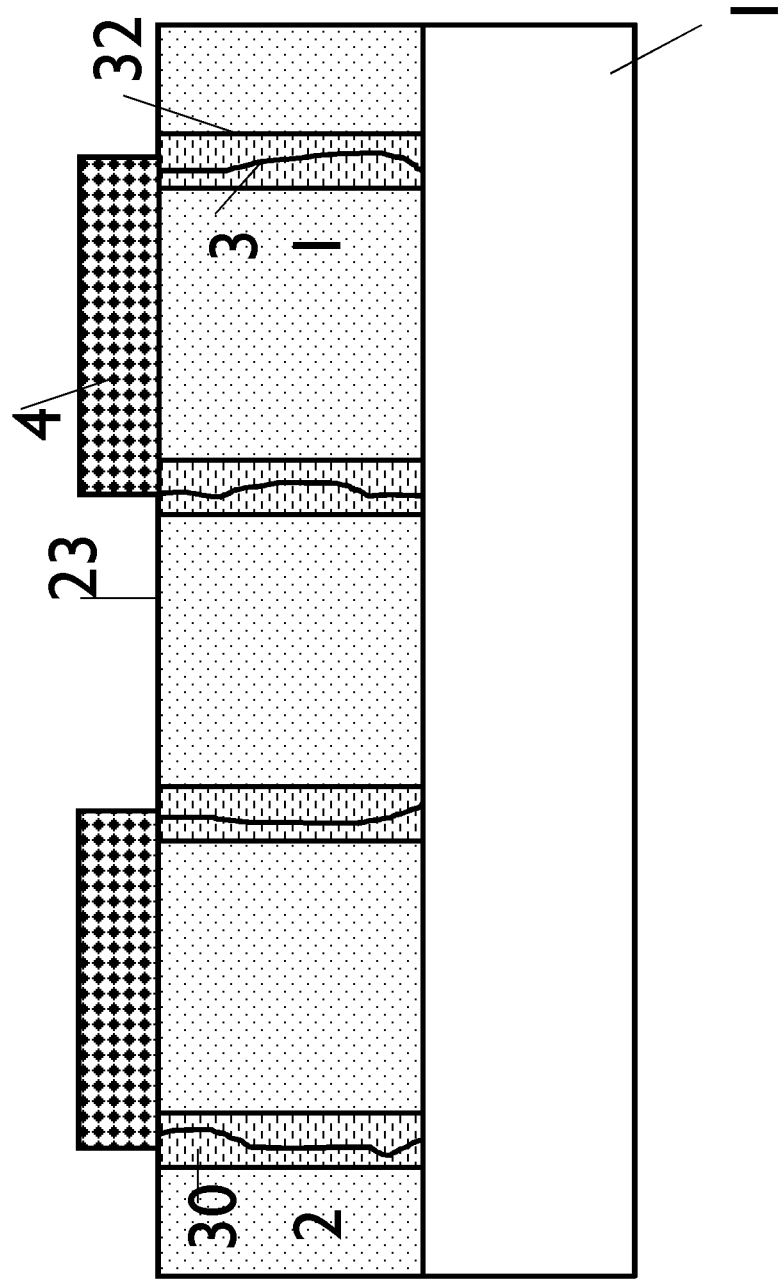
FIG. 2 illustrates a first embodiment of the present invention.

In FIG. 2, a schematic cross-section of an intermediate structure according to some embodiments is disclosed. The active lines 3 of FIG. 1 are recessed by, for instance, etching the first semiconductor material (e.g., Si) between adjacent isolation regions 2. Subsequently, a selective epitaxial growth of a second semiconductor material different from the first semiconductor material is performed within the trenches, to form an active device area 30 comprising the second semiconductor material. The second semiconductor material can, for example, comprise germanium (e.g., Ge, $Si_{1-x}Ge_x$). In some embodiments, an anneal step can be performed after forming the active device area 30. Subsequently, a planarization process such as for instance a CMP (Chemical Mechanical Polishing) process may be performed, in order to remove the second semiconductor material (e.g., Ge, $Si_{1-x}Ge_x$) that has grown above the trench opening, and to provide a planar surface 23. The planar surface 23 forms a substantially planar surface over the active device areas 30 and over the isolation regions 2. As used herein, the term "substantially planar" indicates a surface that has been planarized by, for example, chemical mechanical polishing and can include relatively small step heights between adjacent regions due to differential polishing rates, for example between the semiconductor material of the active device areas 30 and the dielectric materials of the isolation regions 2. For illustrative purposes, only one threading dislocation line 31 is indicated per active device area 30.

A stress-inducing layer 4 is then provided on top of the planar surface 23, which can comprise, for instance, a stressed SiN layer or film. The stressed SiN layer is then patterned using standard lithography and etching techniques.

An anneal process can then be performed at temperatures sufficient to allow the movement of threading dislocations 31 towards the interface 32 between the active region or layer 30 and the isolation structure 2. In some embodiments, it may be preferable to perform the anneal process at a temperature that is so high as to allow excessive relaxation of the patterned stress-inducing layer. Typical annealing temperature can be, for example, between about 450 C and 1100 C, depending upon the geometry of the structure and the composition of the active lines. The patterned stress-inducing layer is then removed or stripped using standard techniques as for instance by means of etching with hot phosphoric acid for a SiN stressed film. In some embodiments, a planarizing process such as, for example, a CMP process can be performed at this point in the process to remove any topography or damage from inserted processing. Standard downstream processing can then further be performed.

Figure 3:
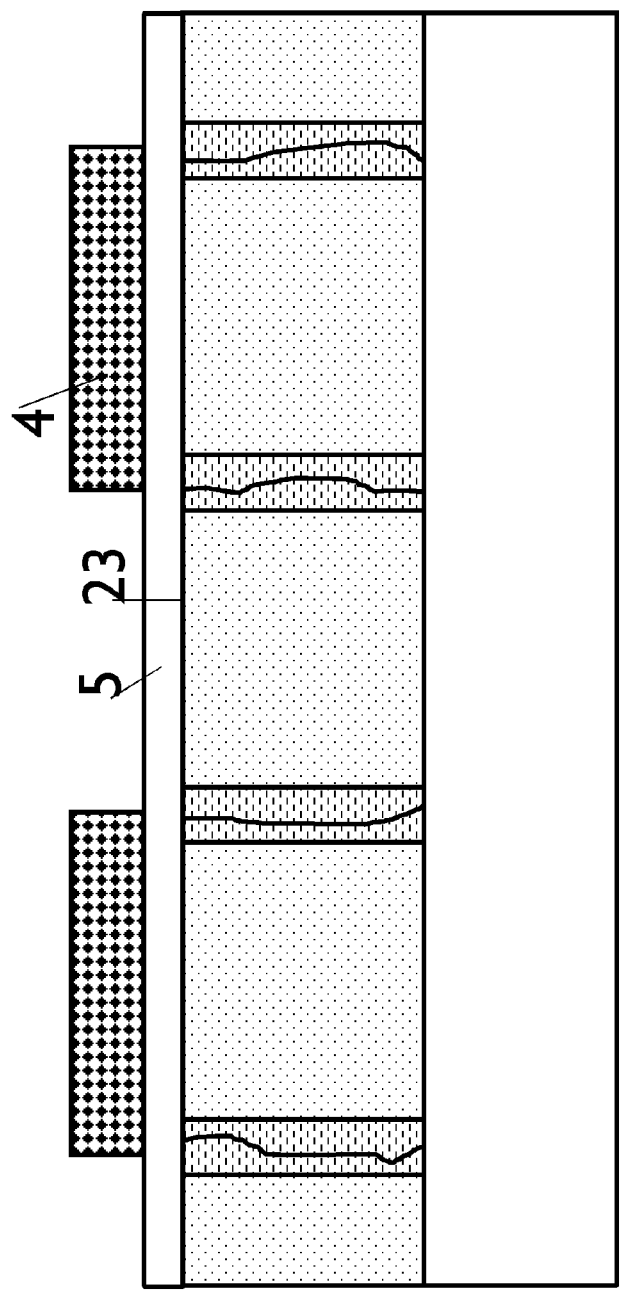
FIG. 3 illustrates a further embodiment of the present invention.

In FIG. 3 another embodiment is depicted, wherein a single screening layer 5 is formed between the stress-inducing layer 4 and the planar surface 23. In some embodiments, the screening layer comprises at least one of silicon oxide (e.g., $SiO_2$) or silicon nitride (e.g., $Si_3N_4$).

Figure 4:
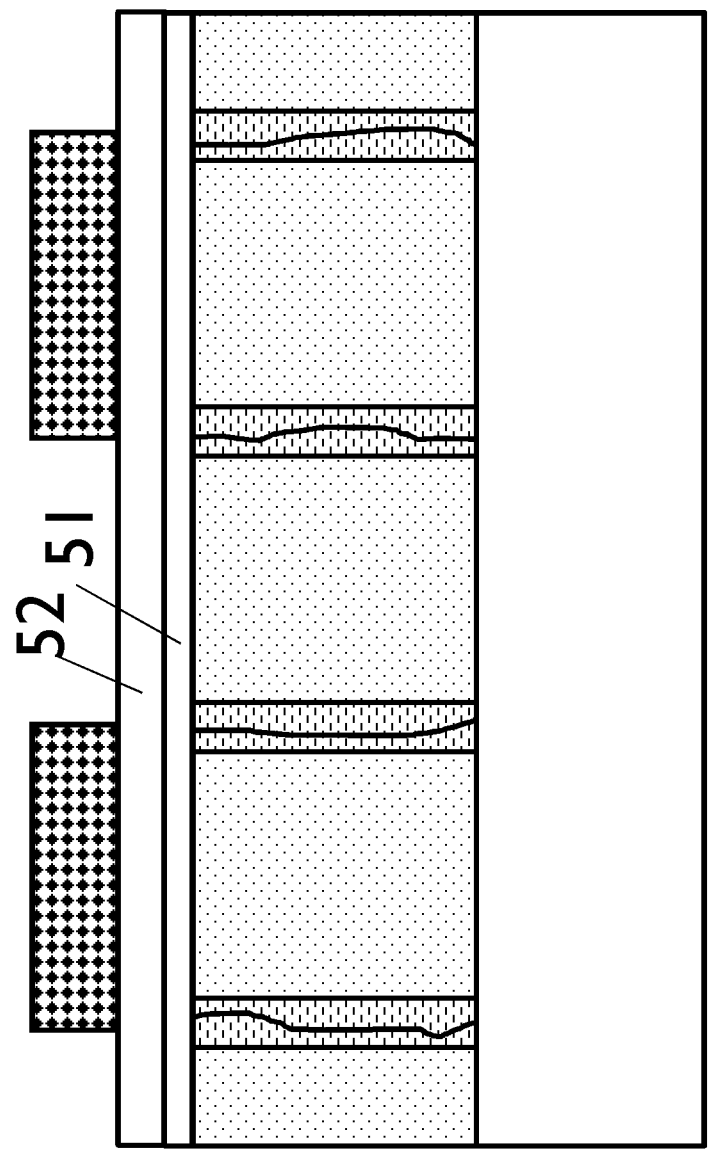
FIG. 4 illustrates a further embodiment of the present invention.

In FIG. 4 a another embodiment is depicted, wherein a plurality of screening layers, for instance first and second screening layers 51 and 52, are provided between the stress-inducing layer 4 and the common substantially flat surface 23. The first and second screening layers 51 and 52 can each comprise silicon oxide or silicon nitride. In some embodiments, the first screening layer 51 comprises silicon nitride and the second screening layer 52 comprises silicon oxide. In other embodiments, the first screening layer 51 comprises silicon oxide and the second screening layer 52 comprises silicon nitride. It yet other embodiments, the first and second screening layers 51 and 52 both comprise silicon nitride having two different compositions, or comprise silicon oxide having two different compositions.

Figure 5:
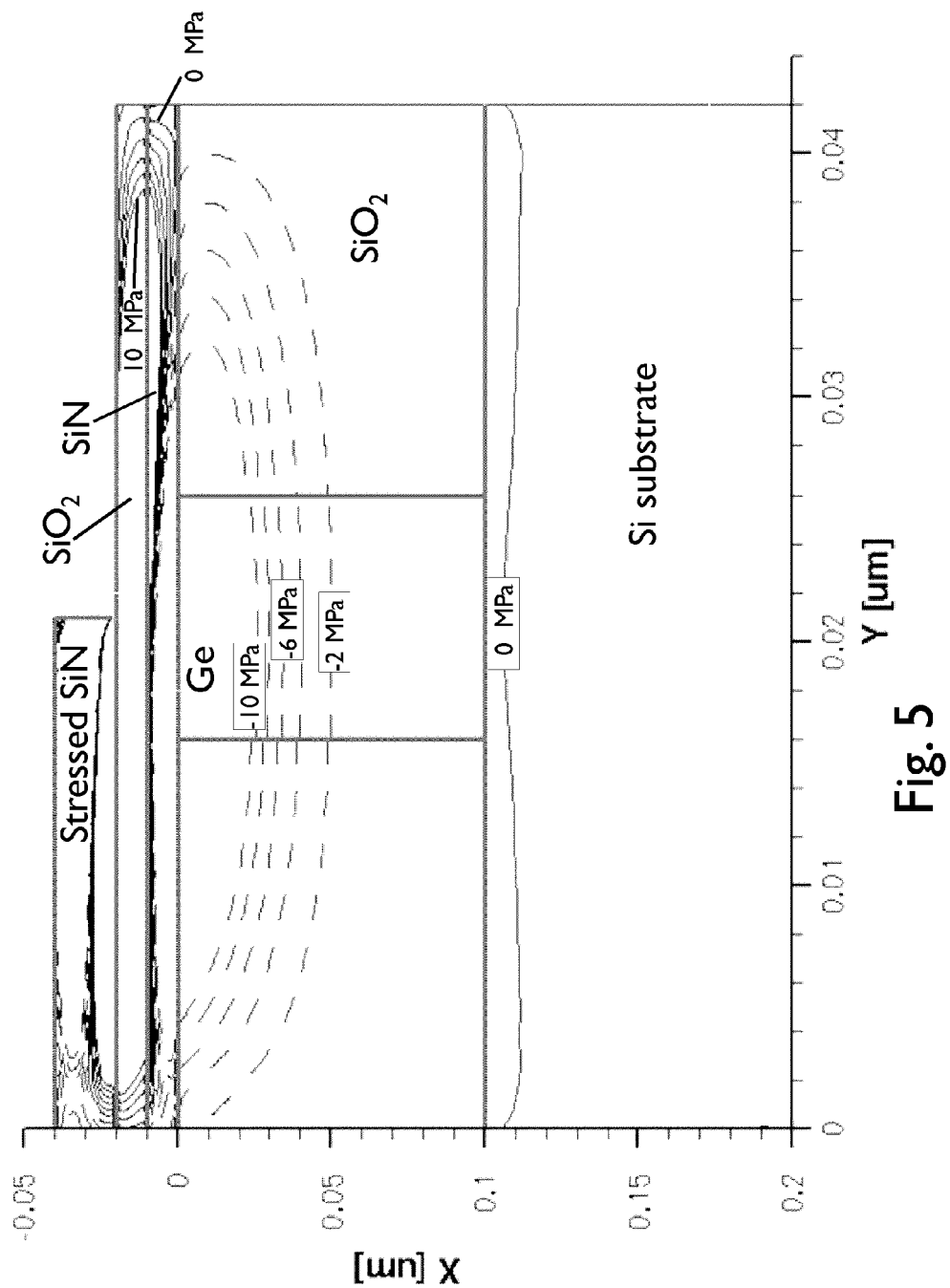
FIGS. 5 to 9 show simulation results supporting embodiments of the present invention.

In FIG. 5 simulation results are depicted which illustrates the nature of the shear stress fields being induced by the stress-inducing layer 4, for the case corresponding to FIG. 4, wherein a germanium active layer 30 formed within silicon oxide isolation regions 2 is subjected to stress induced by a 20 nm thick stress-inducing layer of silicon nitride at an intrinsic stress of 2 GPa. In the simulation results, the first and second screening layers 51 and 52 are silicon nitride and silicon oxide, respectively each having a thickness of 10 nm.

From the simulation results of FIG. 5, it can clearly be seen that the screening layers indeed screen off a portion of the stress field, such that the complementary portion in the active layer 3 is in a shear stress state of largely constant sign (negative in this case). As the direction of movement of a dislocation is determined by the sign of the applied shear stress, having a substantially constant sign for the shear stress down the depth of the active layer insures that the dislocation is consistently moving in the same direction (either left or right, depending upon the burgers vector of the dislocation) along the depth of the active line.

It will be appreciated that the first and second screen layers 51, 52 (e.g., $SiO_2$, SiN) under the stress-inducing layer 4 are unpatterned, and serve to better "absorb" the top sign of the shear stress, allowing only a single sign for shear stress in the active layer. The active layer can for instance be a fin of a transistor device as for instance a finFET device.

Figure 6:
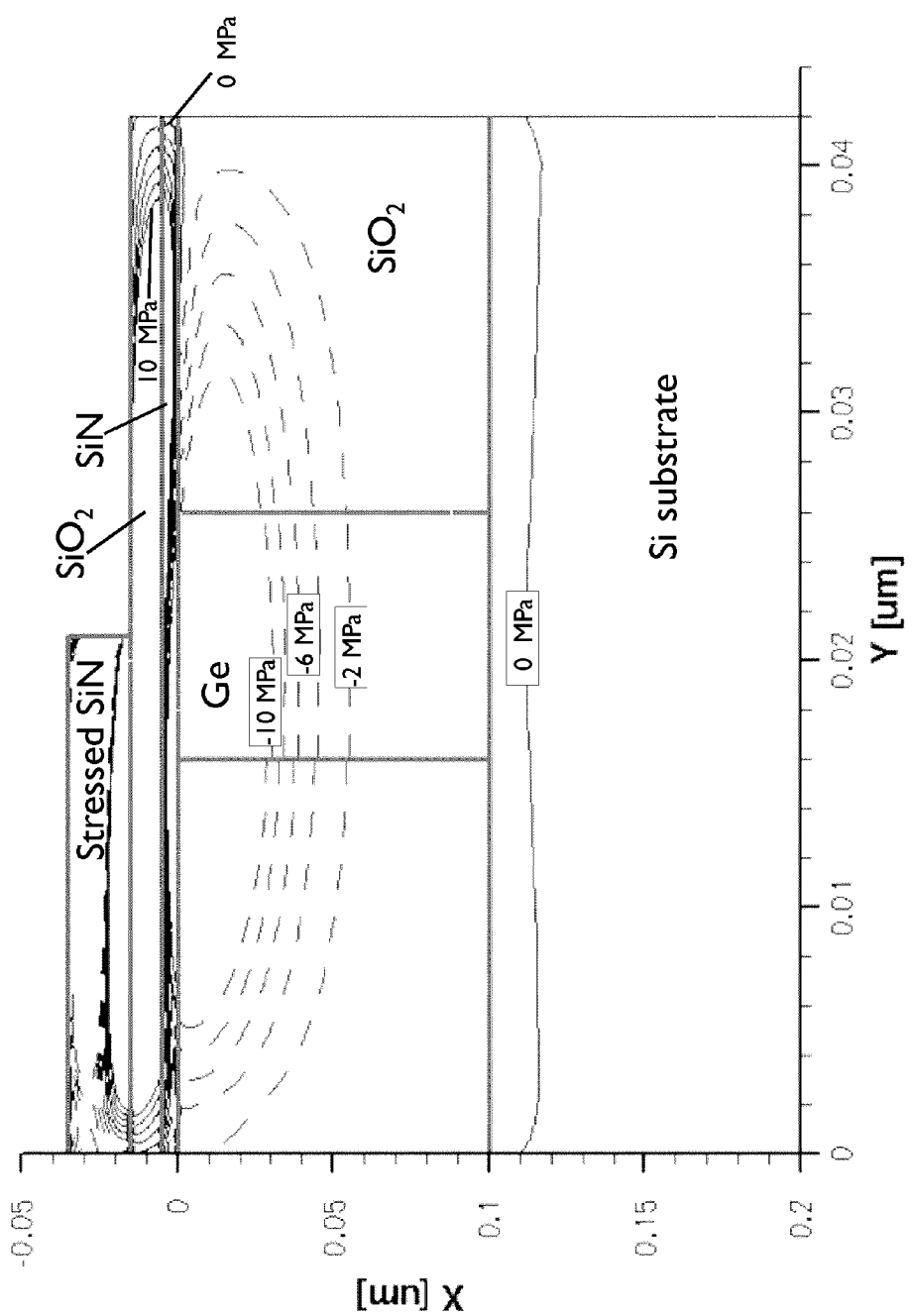

It will be appreciated that a sufficient combined thickness of the first and second screen layers 51 and 52 depends on many factors, including the level of strain that may be present in the active device area 30 that may result at least in part from a lattice mismatch between the first semiconductor of the base substrate 1 (e.g., Si) and the second semiconductor of the active device are 30 (e.g., Ge or $Si_{1-x}Ge_x$). According to some embodiments, a combined thickness of the screening layers is between about 15 nm and 25 nm, for instance about 20 nm. According to other embodiments, a combined thickness of the screening layers is between about 10 nm and 20 nm, for instance about 15 nm. As an illustrative example of an embodiment having a combined thickness of the screening layers between about 10 nm and 20 nm, FIG. 6 depicts an intermediate structure having the same conditions as for FIG. 5, except that the screen nitride is thinned to 5 nm, for a total screening layer thickness of 15 nm.

It will be appreciated that in some embodiments, depositing a first screening layer 51 comprising a silicon nitride and then a second screening layer 52 comprising the silicon oxide before the stress-inducing layer 4, can offer a process advantage of having the silicon oxide to be an etch stop layer for the removal of the stress-inducing layer, and having the screen nitride to be an etch stop for removal of the screen oxide while protecting the isolation regions, e.g. the STI.

Figure 7:
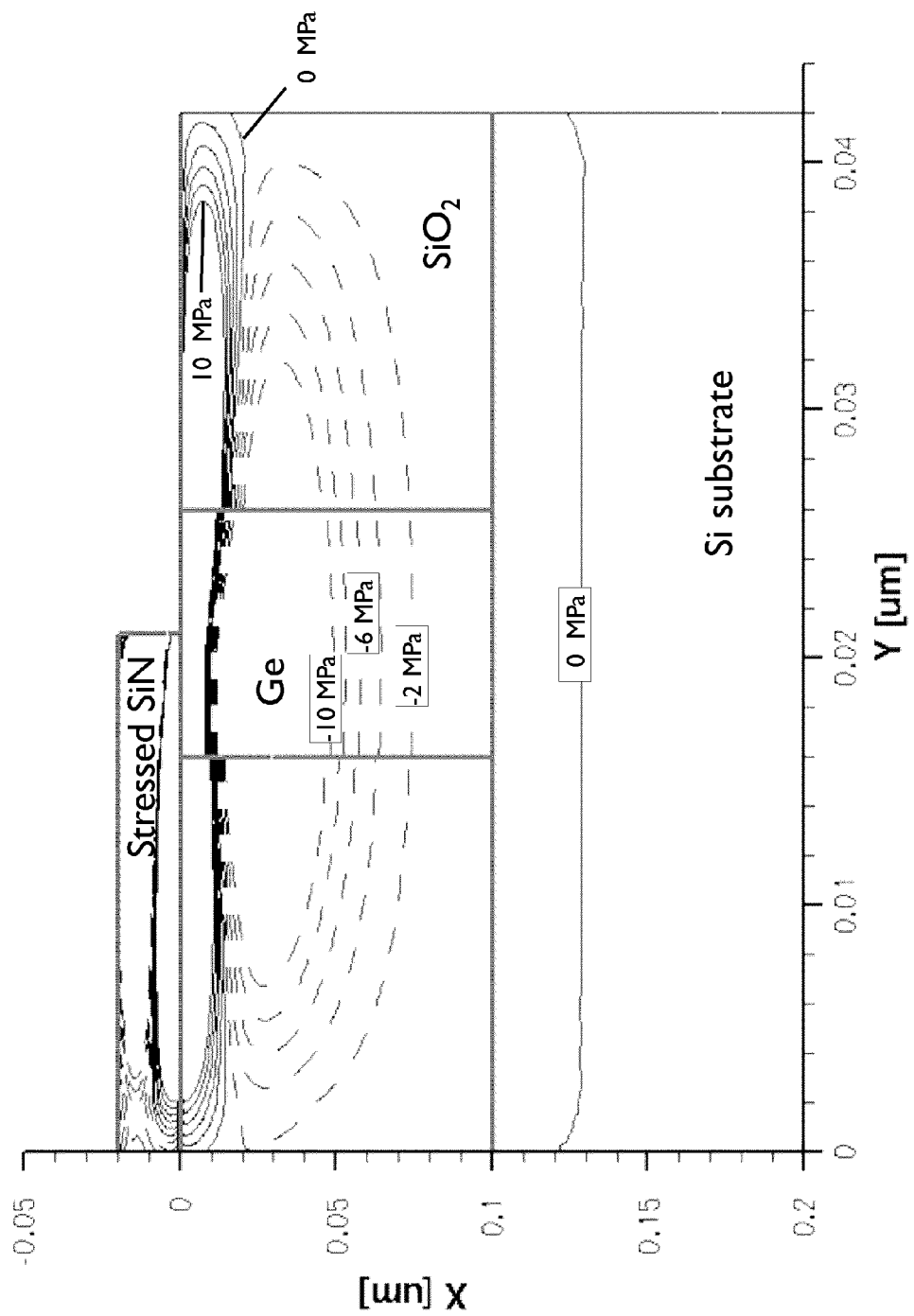

In FIG. 7, simulation results are shown for the same intermediate structure as for FIG. 5, but without the 10 nm screening oxide and 10 nm screening nitride layers. Here, high levels of positive and negative shear stress are seen in the active layer, e.g. in the channel layer 30. While eliminating the screen layers allows the shear stress to be induced in the deeper, lower part of the active layer, the direction of the shear stress at the top or upper part of the active layer is different than in the rest of the line. According to certain embodiments of the present disclosure, the method may further comprise a process of removing said upper part of the active layer. It can be removed for instance by etching or polishing (e.g. CMP). In some embodiments, the upper part of the active layer can be replaced with a different material, e.g. a new upper part can be provided on the lower part. The different material can for instance comprise a high mobility channel material having a high electron and/or hole mobility. The removal can be performed for instance after removal of the stress-inducing layer or after the removal of the screening layer if present.

Figure 8:
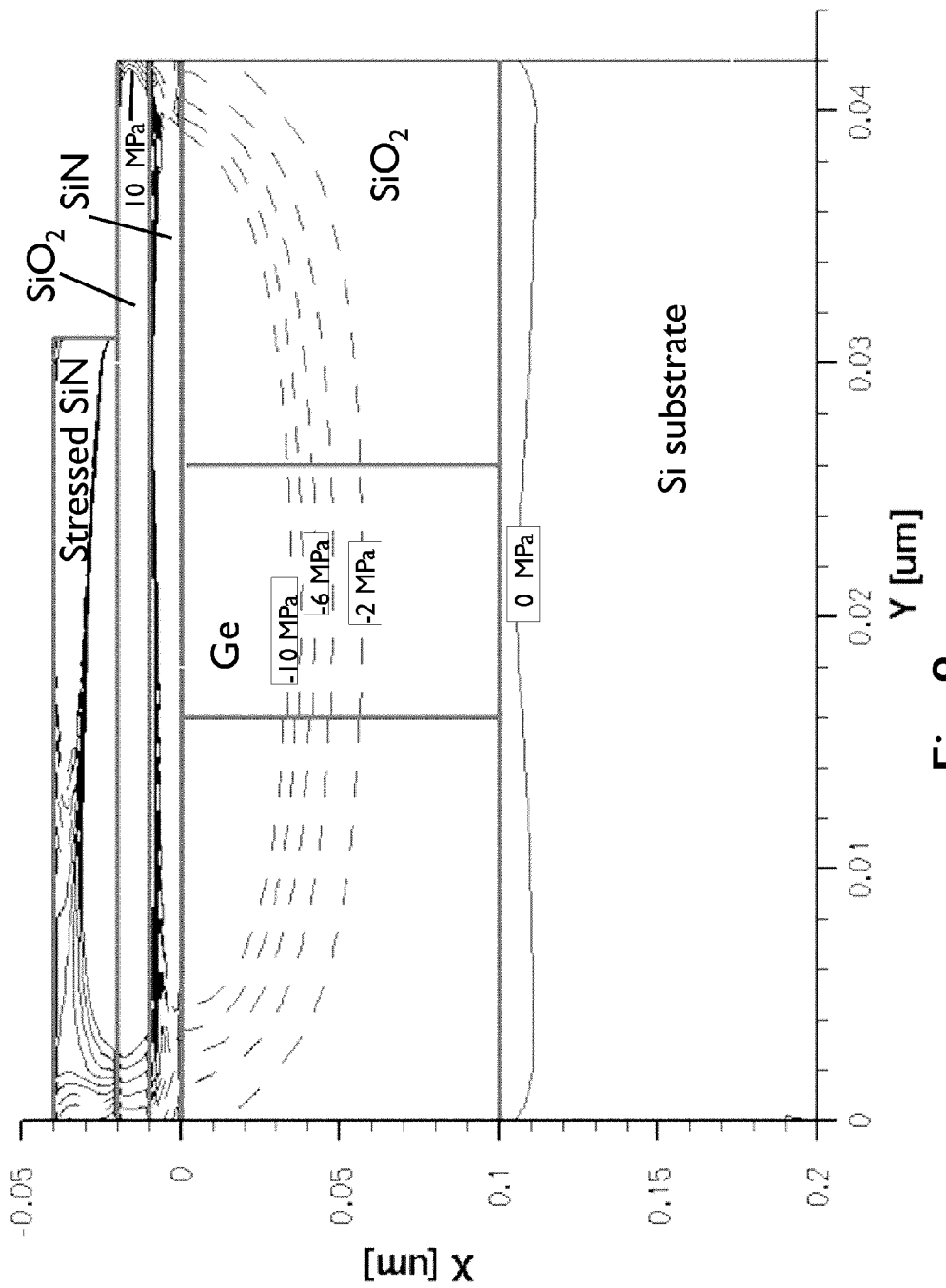

In some embodiments, the mask boundary defining the horizontal edges of the stress-inducing layer 4 over unpatterned screen layer 5 or first and second screen layers 51, 52 is provided over the active layer (as for instance over the "fin"

or the active area). Advantageously, however the results are not substantially influenced by small deviations there from as for instance due to photolithography registration errors, as illustrated in FIG. 8 FIG. 8 illustrates one embodiment of an intermediate structure similar to FIG. 5, except that the alignment of the respective boundary of the stress-inducing layer 4 with the interface 32 is shifted 10 nm to the right in FIG. 8 as compared to FIG. 5. Despite the 10 shift in photolithography registration, the stress field in the Ge active layer is similar.

Figure 9:
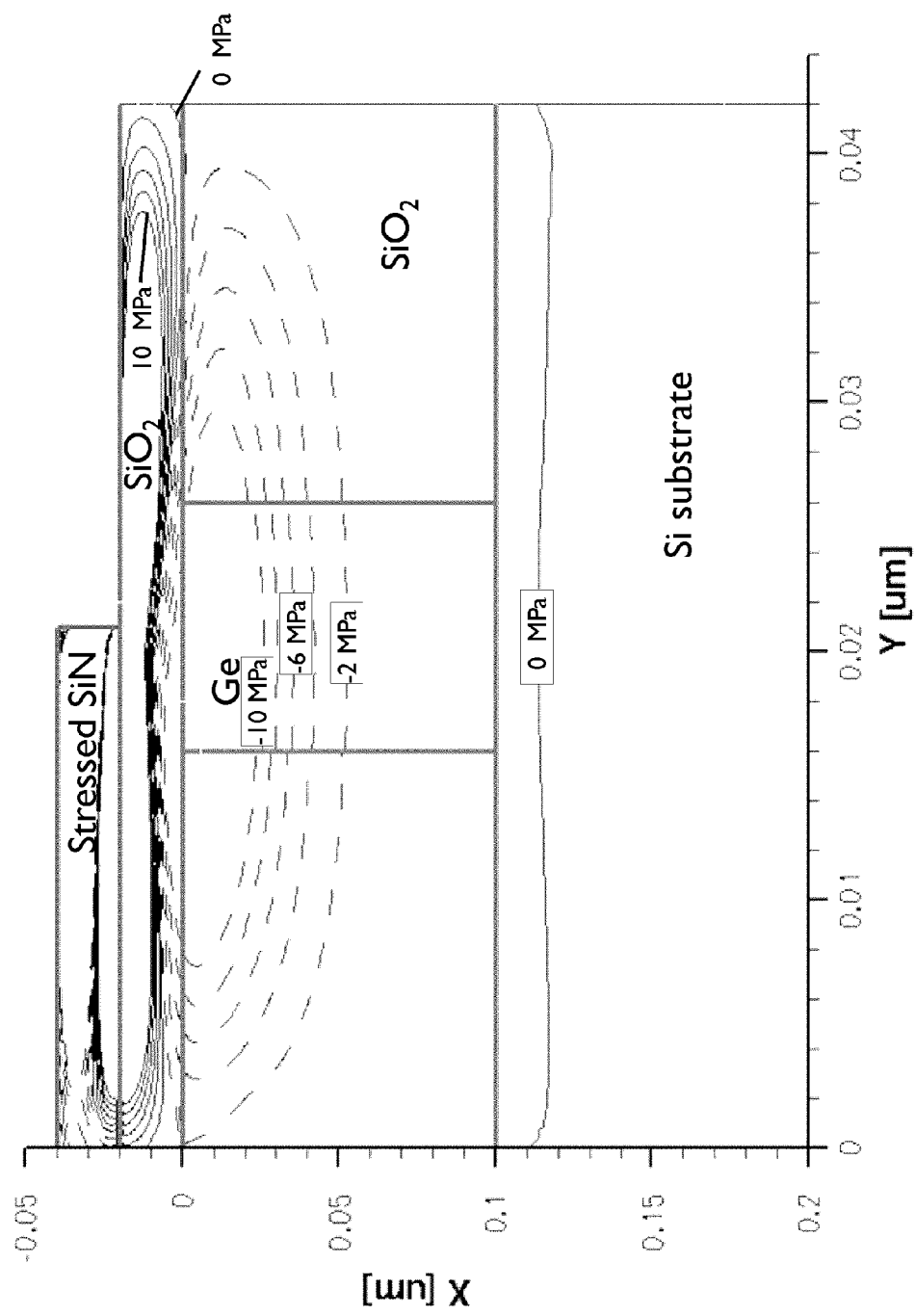

FIG. 9 shows further simulation results for embodiment using a single unpatterned screening layer, here an unpatterned silicon oxide. Here, the same conditions are used as in FIG. 5, but only a single 20 nm $SiO_2$ screen layer is used. Once again, shear stress levels in the Ge layer are similar to that for FIG. 5.

Figure 10:
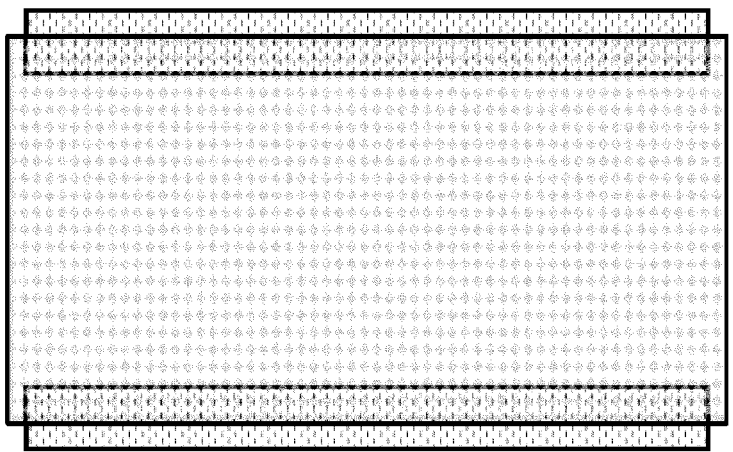
FIGS. 10 to 12 illustrate embodiments according to the present invention.
Figure 10:
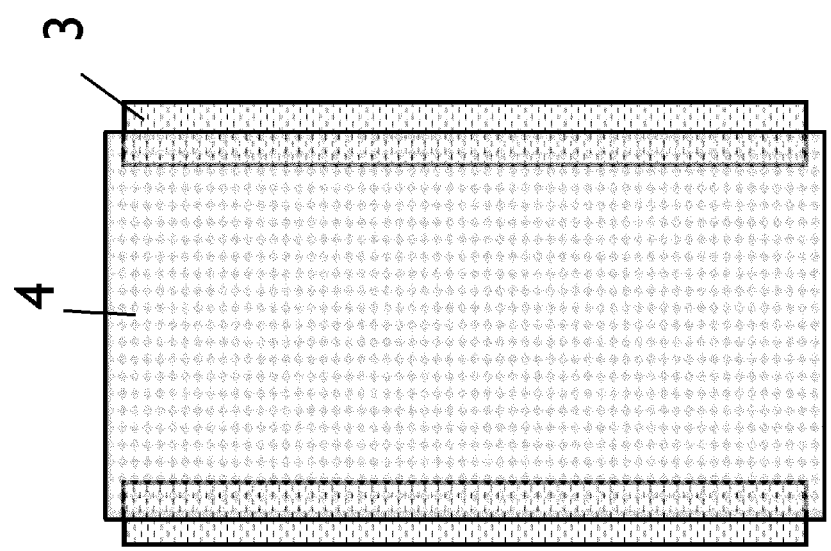
Figure 11:
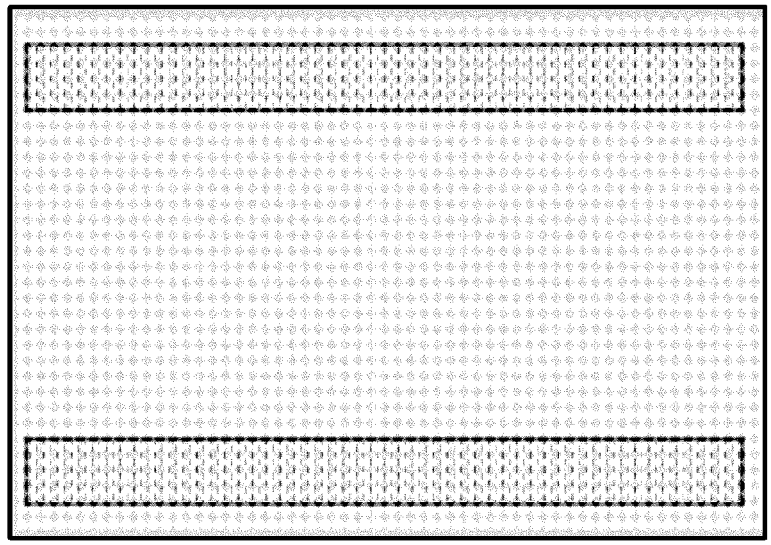
Figure 11:
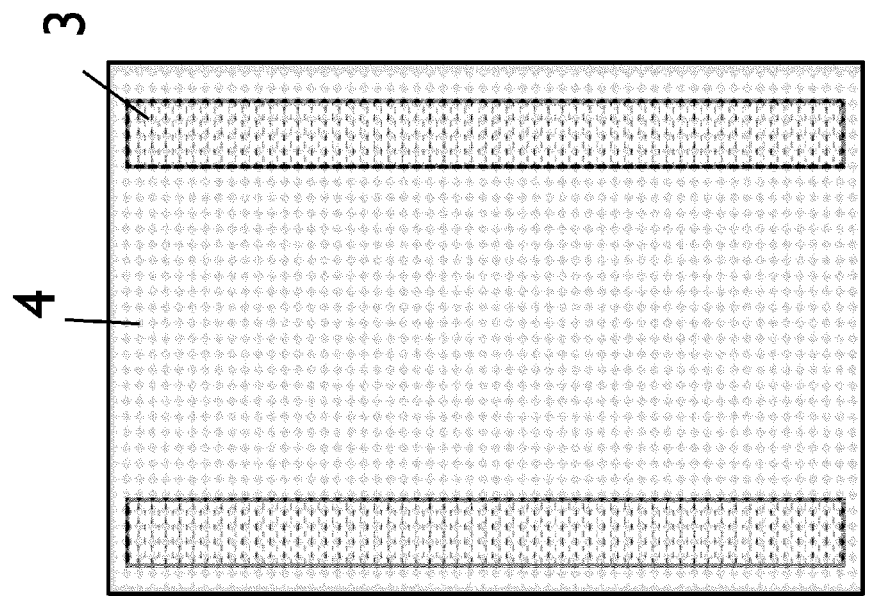
Figure 12:
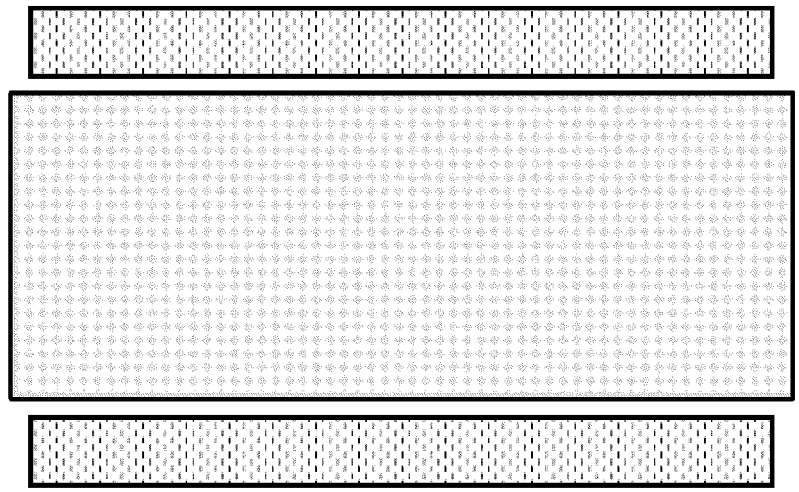
Figure 12:
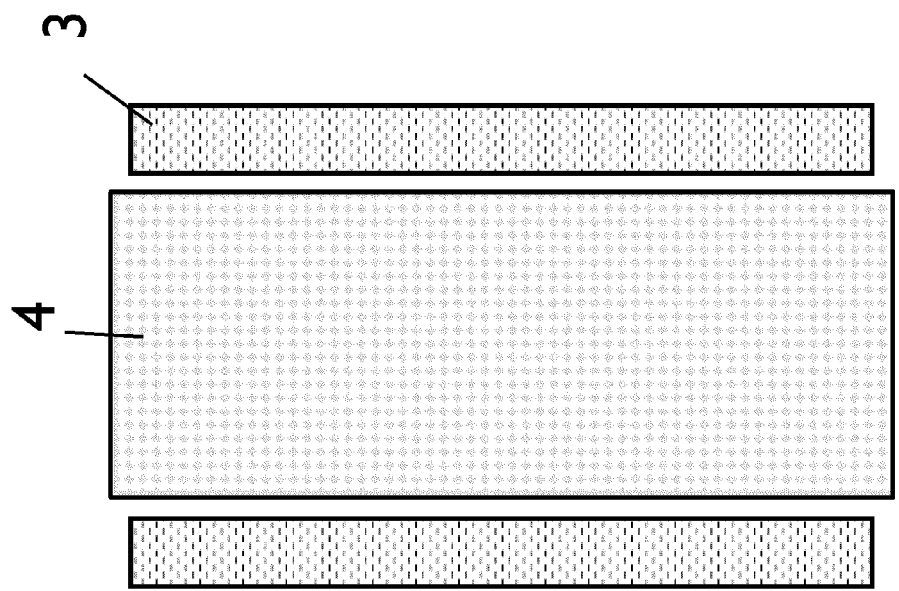

In FIGS. 10, 11, and 12, different embodiments according to the present disclosure are depicted, whereby different relative orientation and dimensioning of stress-inducing layer 4 and active layer or active regions 30 are considered. In FIG. 10 the shear stress is maximized in the active layer 30, whereby the stress-inducing layer (or layer structure) 4 partially overlaps with each of two adjacent active layers or regions 3. The boundaries of the stress-inducing layer 4 are thereby for instance positioned in the middle of the respective active layers 3.

In FIG. 11 the stress-inducing layer (or layer structure) 4 completely overlaps with each of two adjacent active layers or regions 30. Such overlap is asymmetrically w.r.t. active layers 3.

In FIG. 12 a further embodiment is depicted, wherein the stress-inducing layer 4 is provided in between the active layers 3 only, i.e. is provided on the isolation regions.

Preference between embodiments as described in FIGS. 10, 11, and 12 and other embodiments will be an issue of optimization of lithographic, integration, and dislocation reduction constraints.

It will be appreciated that the skilled person is able to derive appropriate durations of the anneal process, given a predetermined process. This can for instance be based on active layer material and dimension, material systems used, magnitude of induced shear stress, and temperature of the anneal process. Background information can for instance be retrieved in "Velocities of Individual Dislocations in Germanium", J. R. Patel and P. E. Freeland, Journal of Applied Physics, 42, 3298-3303 (1971) ("PATEL").

Table 1 illustrates dislocation velocity calculations in germanium at temperatures of 500° C. and 580° C., based on the model and data in "PATEL". Here, the relation $v=v_0(tau/tau_0)^m$ is used, wherein v is dislocation velocity, tau is resolved shear stress, and $v_0$, $tau_0$, and m are fitting parameters in the equation. The values for $v_0$, $tau_0$, and m are temperature and material dependent. For example, at 500° C., a 1 nm/s dislocation movement velocity is achieved at an approximately 1.5 MPa shear stress for germanium. For the same material system, at a temperature of 580° C., the same 1 nm/s dislocation movement velocity is achieved with only a 50 kPa shear stress.

TABLE 1

| | Temperature (° C.) | |
| --- | --- | --- |
| | 500 | 580 |
| $v_0$ (nm/s) | 400 | 5000 |
| $tau_0$ (MPa) | 10 | 10 |
| m | 3.2 | 1.6 |

TABLE 1-continued

| tau (MPa) | v (nm/s) | v (nm/s) |
| --- | --- | --- |
| 10 | 400.000 | 5000.000 |
| 5 | 43.528 | 1649.385 |
| 3 | 8.489 | 728.390 |
| 2 | 2.319 | 380.731 |
| 1 | 0.252 | 125.594 |
| 0.5 | 0.027 | 41.431 |
| 0.3 | 0.005 | 18.296 |
| 0.2 | 0.001 | 9.564 |
| 0.1 | 0.000 | 3.155 |
| 0.05 | 0.000 | 1.041 |
| 0.03 | 0.000 | 0.460 |
| 0.02 | 0.000 | 0.240 |
| 0.01 | 0.000 | 0.079 |

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

What is claimed is:

1. A method for reducing defects in an active device area of a semiconductor device during fabrication, comprising:
   providing a substantially planar surface comprising an active device area adjacent an isolation structure;
   forming a stress-inducing layer over the substantially planar surface and patterning to remove a portion of the stress-inducing layer from the active device area while leaving the stress-inducing layer over the isolation region, the patterned stress-inducing layer being configured to induce a stress field in the active device area, the induced stress field resulting in a shear stress being applied on defects present in the active device area;
   forming at least one screening layer between the patterned stress-inducing layer and the substantially planar surface, the screening layer being configured to screen part of the stress field induced by the patterned stress-inducing layer;
   performing an anneal process after forming the patterned stress-inducing layer over the substantially planar surface, so as to induce a movement of the defects towards a contact interface between the active device area and the isolation structure, wherein the stress field in the active device area has a sign and a magnitude that are conducive to movement of the defects in the active device area towards the contact interface during the anneal process; and removing the patterned stress-inducing layer from the substantially planar surface.

2. The method according to claim 1, wherein the patterned stress-inducing layer comprises silicon nitride.

3. The method according to claim 1, wherein a thickness of the patterned stress-inducing layer is from about 5 nm to about 100 nm.

4. The method according to claim 1, wherein forming the at least one screening layer includes forming an unpatterned blanket layer.

5. The method according to claim 1, wherein the at least one screening layer comprises silicon oxide.

6. The method according to claim 1, wherein the at least one screening layer comprises a first deposited layer comprising silicon nitride and a second deposited layer comprising silicon oxide.

7. The method according to claim 1, wherein forming the patterned stress-inducing layer on the substantially planar surface comprises providing an unpatterned stress-inducing layer and patterning the unpatterned stress-inducing layer by etching, and wherein a screening layer or an upper layer of a plurality of screening layers are adapted for serving as an etch stop layer for a patterned etch of the patterned stress-inducing layer.

8. The method according to claim 1, wherein a combined total thickness of the at least one screening layers is from about 5 nm to about 50 nm.

9. The method according to claim 1, wherein the patterned stress-inducing layer comprises silicon nitride, an upper screening layer comprises silicon oxide, and a lower screening layer comprises silicon nitride.

10. The method according to claim 1, wherein the active device area comprises germanium.

11. The method according to claim 1, wherein the active device area comprises $Si_xGe_{1-x}$, where x is from about 0 to about 0.8.

12. The method according to claim 1, wherein the anneal process is performed at a temperature of from about 450° C. to about 1100° C.

13. The method according to claim 1, wherein forming the patterned stress-inducing layer comprises providing a stress-inducing layer and patterning the stress-inducing layer, and wherein patterning the stress-inducing layer includes defining features on the substantially planar surface with boundaries which are substantially parallel to boundaries of the active device area.

14. The method according to claim 1, further comprising removing an upper part of the active device area.

* * * * *